(12) United States Patent
Kwok et al.

(10) Patent No.: US 7,923,911 B2
(45) Date of Patent: Apr. 12, 2011

(54) POLYCRYSTALLINE SILICON AS AN ELECTRODE FOR A LIGHT EMITTING DIODE AND METHOD OF MAKING THE SAME

(75) Inventors: Hoi Sing Kwok, Hong Kong (CN); Man Wong, Hong Kong (CN); Zhiguo Meng, Hong Kong (CN); Jiaxin Sun, Hong Kong (CN); Xiuling Zhu, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 167 days.

(21) Appl. No.: 12/339,431

(22) Filed: Dec. 19, 2008

(65) Prior Publication Data
US 2009/0134790 A1    May 28, 2009

Related U.S. Application Data

(63) Continuation of application No. 11/272,471, filed on Nov. 10, 2005, now abandoned.

(60) Provisional application No. 60/627,745, filed on Nov. 15, 2004, provisional application No. 60/669,376, filed on Apr. 8, 2005.

(51) Int. Cl.
*H01L 29/78* (2006.01)
*H01L 29/08* (2006.01)
*H01J 1/62* (2006.01)

(52) U.S. Cl. ........ 313/487; 257/241; 257/249; 257/483; 313/483; 427/66

(58) Field of Classification Search .................. None
See application file for complete search history.

(56) References Cited

U.S. PATENT DOCUMENTS

| | | | |
|---|---|---|---|
| 5,245,452 A | 9/1993 | Nakamura et al. |
| 5,451,802 A | 9/1995 | Komobuchi et al. |
| 5,471,330 A | 11/1995 | Sarma |
| 5,550,066 A | 8/1996 | Tang et al. |
| 5,705,829 A | 1/1998 | Miyanaga et al. |
| 5,714,837 A | 2/1998 | Zurn et al. |
| 5,893,730 A | 4/1999 | Yamazaki et al. |
| 6,262,441 B1 | 7/2001 | Bohler et al. |
| 6,661,180 B2 | 12/2003 | Koyama |
| 6,737,674 B2 | 5/2004 | Zhang et al. |

(Continued)

FOREIGN PATENT DOCUMENTS

JP    07036059 A    2/1995

OTHER PUBLICATIONS

Moriwake et al., Japanese Patent application JP-07036059,Feb. 1995,machine translation.*

(Continued)

*Primary Examiner* — Nimeshkumar D Patel
*Assistant Examiner* — Tracie Green
(74) *Attorney, Agent, or Firm* — Leydig, Voit & Mayer, Ltd.

(57) ABSTRACT

Metal induced polycrystallized silicon is used as the anode in a light emitting device, such as an OLED or AMOLED. The polycrystallized silicon is sufficiently non-absorptive, transparent and made sufficiently conductive for this purpose. A thin film transistor can be formed onto the polycrystallized silicon anode, with the silicon anode acting as the drain of the thin film transistor, thereby simplifying production.

41 Claims, 19 Drawing Sheets

Light

U.S. PATENT DOCUMENTS

| | | |
|---|---|---|
| 6,764,368 B2 | 7/2004 | Hasan et al. |
| 2001/0026257 A1 | 10/2001 | Kimura |
| 2003/0038593 A1 | 2/2003 | Aziz et al. |
| 2003/0085401 A1 | 5/2003 | Joo et al. |
| 2003/0127650 A1 | 7/2003 | Park et al. |
| 2003/0129853 A1 | 7/2003 | Naoto et al. |
| 2003/0181043 A1 | 9/2003 | Tanada et al. |
| 2003/0207589 A1 | 11/2003 | Li et al. |
| 2003/0227590 A1 | 12/2003 | Oke et al. |
| 2004/0004433 A1 | 1/2004 | Lamansky et al. |
| 2004/0113544 A1 | 6/2004 | Murakami et al. |
| 2004/0207312 A1 | 10/2004 | Takashima et al. |
| 2004/0222737 A1* | 11/2004 | Raychaudhuri et al. ...... 313/504 |
| 2004/0232420 A1 | 11/2004 | Lee et al. |
| 2004/0245918 A1 | 12/2004 | Lee |
| 2005/0173700 A1 | 8/2005 | Liao et al. |
| 2005/0227091 A1 | 10/2005 | Suto et al. |
| 2006/0175621 A1 | 8/2006 | Ohtsuka et al. |

OTHER PUBLICATIONS

Acta Physica Sinica, vol. 54, No. 7, Jul. 2005. and English abstract.

Peng et al. Appl. Phys. Lett. 88, 033509, 2006.

* cited by examiner

POLYCRYSTALLINE SILICON AS AN ELECTRODE FOR A LIGHT EMITTING DIODE AND METHOD OF MAKING THE SAME

CROSS-REFERENCE TO RELATED APPLICATIONS

This application is Continuation of U.S. patent application Ser. No. 11/272,471 filed Nov. 10, 2005, which claims priority from U.S. Provisional Application Ser. No. 60/669,376 filed Apr. 8, 2005 and U.S. Provisional Application Ser. No. 60/627,745 filed Nov. 15, 2004, the entire disclosures of the foregoing Applications are incorporated herein by reference.

FIELD OF THE INVENTION

The present invention relates to the use of polycrystalline silicon (poly Si) as an anode or pixel electrode in a light emitting device, for example an Organic Light Emitting Diode (OLED). The invention further relates to an active matrix display comprising an array of such pixels and to methods of making such devices.

BACKGROUND ART

Flat-panel displays are an important technology and will soon become dominant in the display industry. Flat displays typically are plasma displays or Liquid Crystal Displays (LCDs), although LED displays, in particular OLED display technology, are proving very promising.

OLED displays generally consist of an array of organic light emitting diodes which are self-emissive, once proper forward bias is applied between the anode and cathode.

U.S. Pat. No. 5,550,066, issued on 27 Aug. 1996 to Ching W. Tang; Biay C. Hseih, for "Method of fabricating a TFT-EL pixel", teaches a method of fabricating an Active Matrix OLED (AMOLED) using a poly-Si gate thin film transistor (TFT). The TFT is used in an active-addressing scheme. A transparent indium-tin oxide (ITO) layer, in contact with a drain region of the TFT serves as the anode for the organic electroluminescent material.

U.S. Pat. No. 6,262,441, issued on 17 Jul. 2001, to Achim Bohler; Stefan Wiese; Dirk Metzdorf; Wolfgang Kowalsky, for "Organic light emitting diode including an organic functional layer between electrodes", teaches fabricating low operating voltage OLED using a semitransparent metal layer located on the bottom electrode.

U.S. Pat. No. 5,705,829, issued on 6 Jan. 1998, to Miyanaga, H. Ohtani, Y. Takemura, for "Semiconductor device formed using a catalyst element capable of promoting crystallization", teaches techniques of forming metal-induced poly-Si and the construction of thin-film transistors on the resulting films.

U.S. Pat. No. 5,893,730, issued on 13 Apr. 1999, to S. Yamazaki, A. Miyanaga, J. Koyama, T. Fukunaga, for "Thin film semiconductor and method for manufacturing the same, semiconductor device and method for manufacturing the same", teaches improved techniques of forming metal-induced poly-Si using crystal seeds.

US Published Patent Application No. 2003129853, published 10 Jul. 2003, in the names of Kusumoto Naoto; Nakajima Setsuo; Teramoto Satoshi; Yamazaki Shunpei, for "Method for producing semiconductor device", teaches forming metal-induced poly-Si using spin-coating of nickel-containing solutions.

U.S. Pat. No. 6,737,674, issued on 18 May 2004, to Zhang, Hongyong, Ohnuma, Hideto, for "Semiconductor device and fabrication method thereof", teaches eliminating nickel from metal-induced poly-Si using phosphorus doping.

FIG. 1 is a schematic cross-section of a reference example of a conventional organic light emitting diode (OLED) 01. A glass substrate 02 has coated thereon an ITO (Indium Tin Oxide) film 12 as a transparent anode electrode. An organic functional layer 16 (itself formed of several layers) is formed on the ITO anode 12. A bi-layer cathode 18 is formed on the functional layer 16.

It is an aim of the present invention to provide a new approach to light emitting devices, usefully one that may simplify construction.

SUMMARY OF THE INVENTION

According to one aspect, the invention provides a light emitting device, the anode of which is made of polycrystalline silicon.

According to a second aspect, the invention provides a light emitting device, with an anode, light emission layer and cathode, wherein the anode is made of polycrystalline silicon.

According to a third aspect, the invention provides a light emitting device, with an anode, an anode modification layer for holes injection, a plurality of organic layers for electron and hole transport, an organic layer for light emission and one or more cathode layers, where the anode is made of low temperature polycrystalline silicon.

According to a fourth aspect, the invention provides an active matrix light emitting device, with an anode, one or more light emission layers, a cathode, and a transistor, wherein the anode comprises an active island of the transistor.

According to a fifth aspect, the invention provides an active matrix light display with an array of pixels, each of which has an anode, one or more light emission layers, a cathode and a transistor, the anode being made of low temperature polycrystalline silicon.

According to a sixth aspect, the invention provides a method of forming a light emitting device, including forming an anode, forming one or more light emission layers and forming a cathode on the other side of the one or more light emission layers from the anode, where the anode is formed of polycrystalline silicon.

The present invention teaches the use of Low Temperature Poly-Si (LTPS) as electrodes in displays, which are usable in a wide variety of ambient lighting conditions. No indium-tin oxide (ITO) need be used.

BRIEF DESCRIPTION OF THE DRAWINGS

The invention may be further understood from the following description of one or more non-limitative, exemplary embodiments, with reference to the accompanying drawings, in which:—

DETAILED DESCRIPTION OF THE INVENTION

The inventors of the present invention have determined that Poly-Si can be made with a sufficiently low absorptivity, combined with sufficient transparency in the relevant spectrum to work as an anode in a light emitting device and can be made highly conductive with the incorporation of appropriate dopants. Conventional poly-Si does not have the required optical or conductive characteristics.

Such Poly-Si, especially Low Temperature Poly-Si (LTPS) electrodes can be integrated in the construction of thin-film transistors. The LTPS possesses adequately high electrical conductance and low absorption of visible light. Integration is possible since LTPS can also be used in the construction of thin-film transistors.

Suitable processes for crystallizing the silicon, whilst making it sufficiently absorptive include, inter alia, metal induced crystallization (MIC), e.g. metal induced crystallization with cap layer (MICC), continuous grain silicon (CGS), giant grain silicon (GGS), metal-induced lateral crystallization (MILC) e.g. metal-induced unilateral crystallization (MIUC), metal-induced bilateral crystallization (MIBC), metal-induced radial crystallization (MIRC), peripherally crystallized poly-Si (PCP) et al., and laser annealing of amorphous silicon, and a combination of MIC and laser crystallization.

Figure 2:
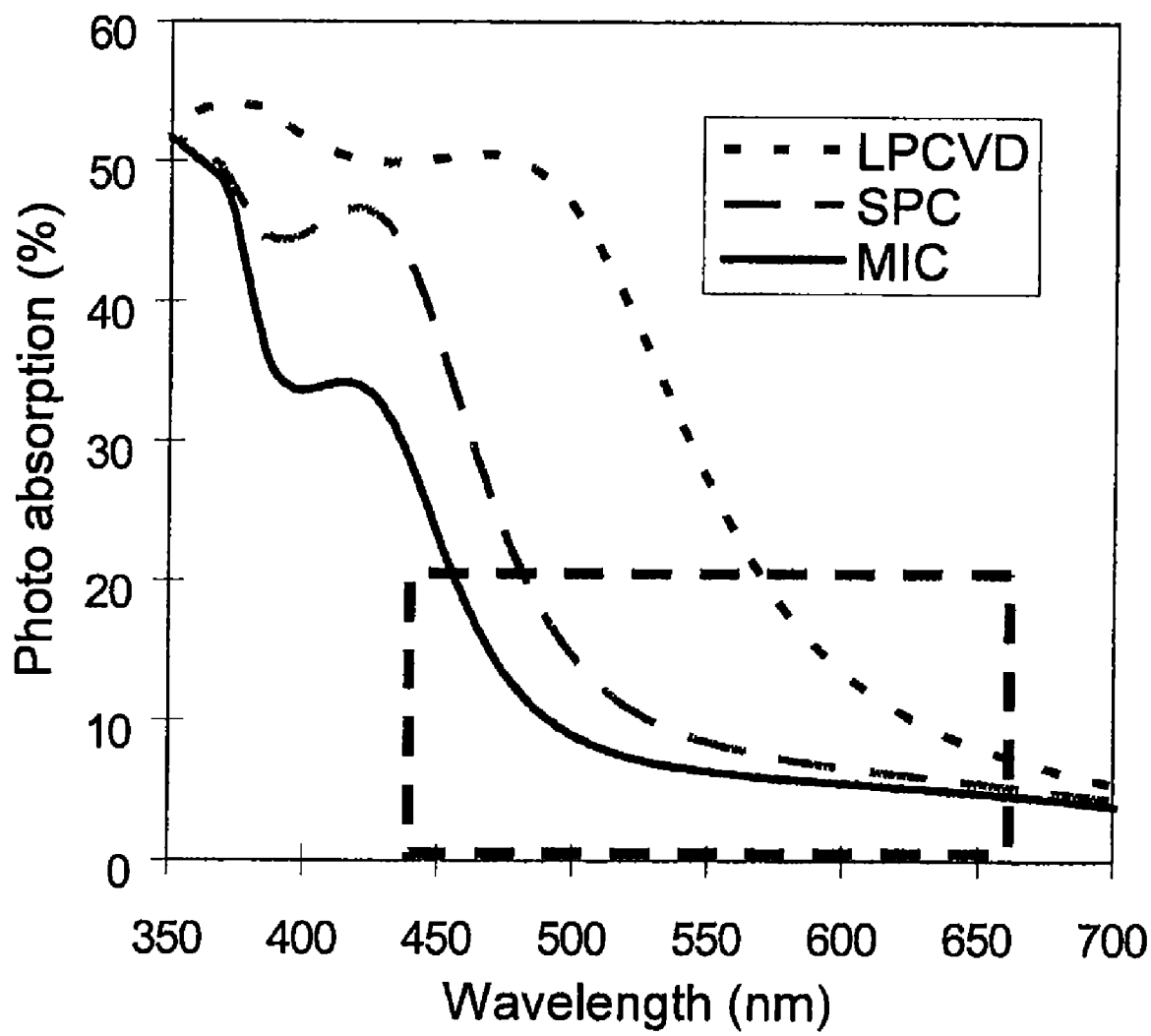
FIG. 2 is a graph of absorptivity-wavelength characteristics fro different types of poly-Si.

FIG. 2 is a graph showing curves of photo-absorption against wavelength of light for MIC poly-Si, low pressure chemical vapor deposition (LPCVD) poly-Si and solid phase crystallization (SPC) poly-Si, for these measurements taken through a 1.1 mm glass substrate. Whilst SPC poly-Si absorbs less than LPCVD poly-Si, MIC poly-Si performs best. The poly-Si used in embodiments of the present invention should preferably have an average absorptivity in the visible light region of from 450 nm to 650 nm of no more than 30% and preferably no more than around 20%. For MIC, the average absorptivity is lower than 20%.

Figure 3:
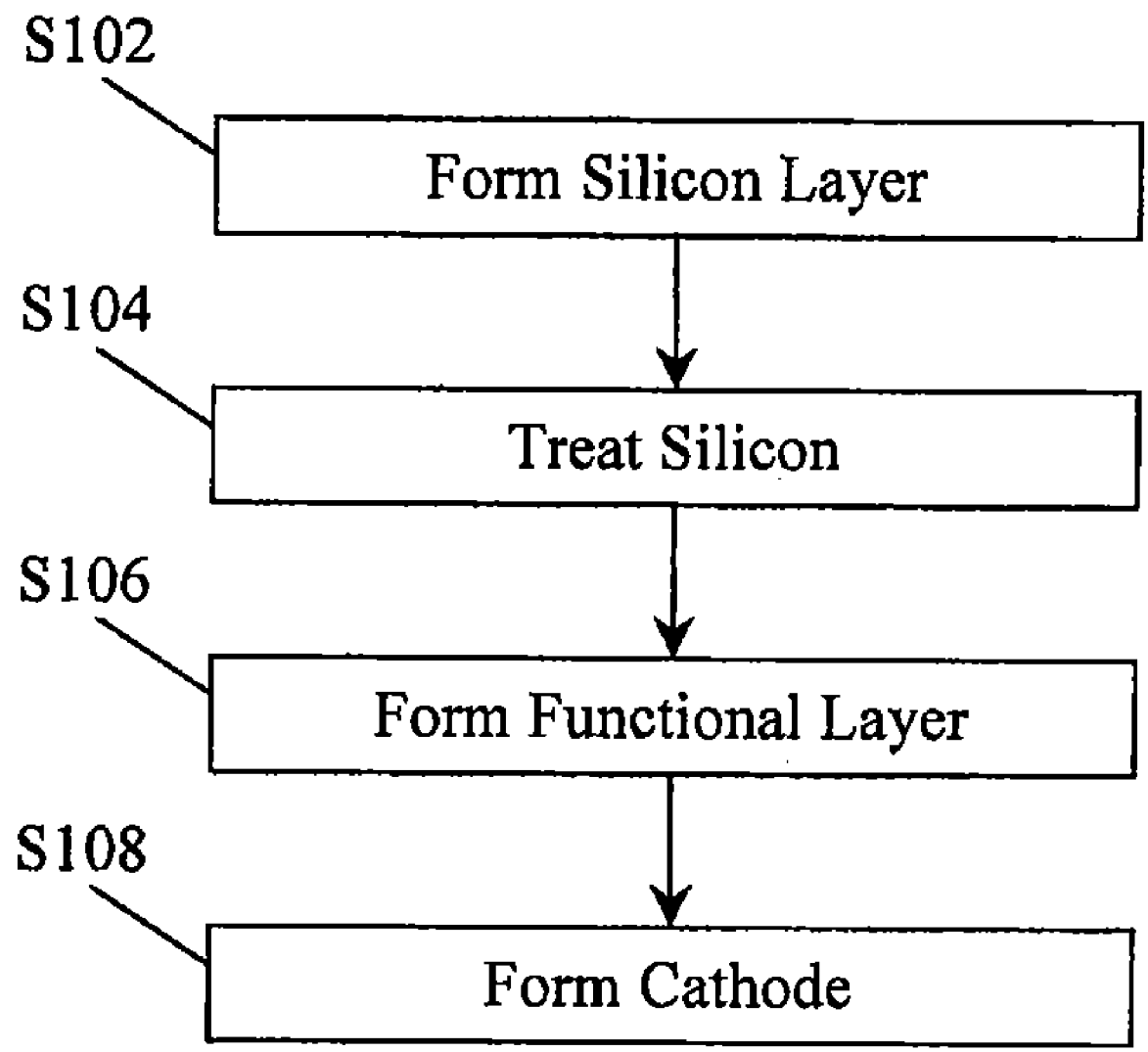
FIG. 3 is a flowchart relating to forming an organic light emitting device.

FIG. 3 is a flowchart relating to forming an organic light emitting device, according to a first embodiment of the invention.

An amorphous silicon film is formed on a substrate (step S102). The silicon film is crystallized into poly-Si and otherwise treated as required (step S104). A functional layer is formed above the silicon layer (step S106). A cathode is formed on the functional layer (step S108).

The substrate is generally at least translucent and, preferably, transparent, typically glass or quartz. The silicon film is thin, typically from 10 nm to 3 µm (microns) thick, preferably from 30 nm to 100 nm and more preferably around 50 nm thick, and typically formed at a temperature between 150° C. to 600° C., although dependent on the substrate and what temperatures that can readily endure, using any of a number of known techniques including but not limited to sputtering, evaporation and chemical vapor deposition.

A buffer layer is usually provided between the substrate and the silicon layer. The buffer layer should be able to withstand the relevant process temperatures of the later processing (if necessary for an extended period of time), for instance during crystallization of the silicon. Typical materials for the buffer layer are LTO or $SiN_x$ or $LTO+SiN_x$.

The functional layer generally involves a Hole Injection Layer (HIL) or an anode modification layer, a Hole Transport Layer (HTL), at least one light Emissive Layer (EML) and an Electron Transport Layer (ETL), in sequence from bottom to top. However, at least one embodiment below does not have an HIL. In at least one other embodiment the EML and the ETL are the same layer. Suitable materials for these purposes are well-known.

A typical HIL may be a thin inorganic layer, for instance $V_2O_5$, $RuO_2$, PrO, $NiO_x$, $MoO_x$ and $CuO_x$, with, for example, a thickness in the range of 0.5 nm-5 nm. Alternatively, the anode modification layer may be an ultra-thin metal layer such as Pt or Au, with, for example, a thickness in the range of 0.5 nm-3 nm. Another typical alternative for the anode modification layer may be a p-type doped organic layer, such as $F_4$-TCNQ (tetrafluoro-tetracyano-quinodimethane) doped m-MTDATA (4,4',4" -tris(N-3-methylphenyl-N-phenyl-amino)-triphenyl-amine), for example with a doping ratio of 1% (by mole). A typical thickness is 40 nm.

A typical HTL is NPB (N,N-bis-(1-naphthyl)-N,N-diphenyl-1,1-biphenyl-4,4-diamine). A typical thickness is in the range of from 10 to 50 nm.

A typical EML is $Alq_3$ (tris-(8-hydroxyquinoline) aluminum) doped with C545-T (10-(2-benzothiazolyl)-1,1,7,7-tetramethyl-2,3,6,7-tetrahydro-1H,5H,11H-benzo [1] pyrano [6,7,8-ij] quinolizin-11-one). A typical doping is 2% (by weight). A typical thickness is 30 nm.

A typical ETL is undoped $Alq_3$. A typical thickness is 20 nm.

For greater efficiency, the cathode may be reflective, for example a monolayer metal (e.g. Al or Ag), a bi-layer structure (e.g. LiF/Al) or a tri-layer structure (e.g., LiF/Al/Ag or LiF/Ca/Ag). For the bi-layer and tri-layer structures, the lower layer may be very thin. For instance, for LiF/Al, typical thicknesses may be LiF 1 nm and Al 100 nm.

The organic layers and metal may be formed by thermal evaporation in separate vacuum chambers, typically at pressures lower than $10^{-6}$ torr.

Figure 4:
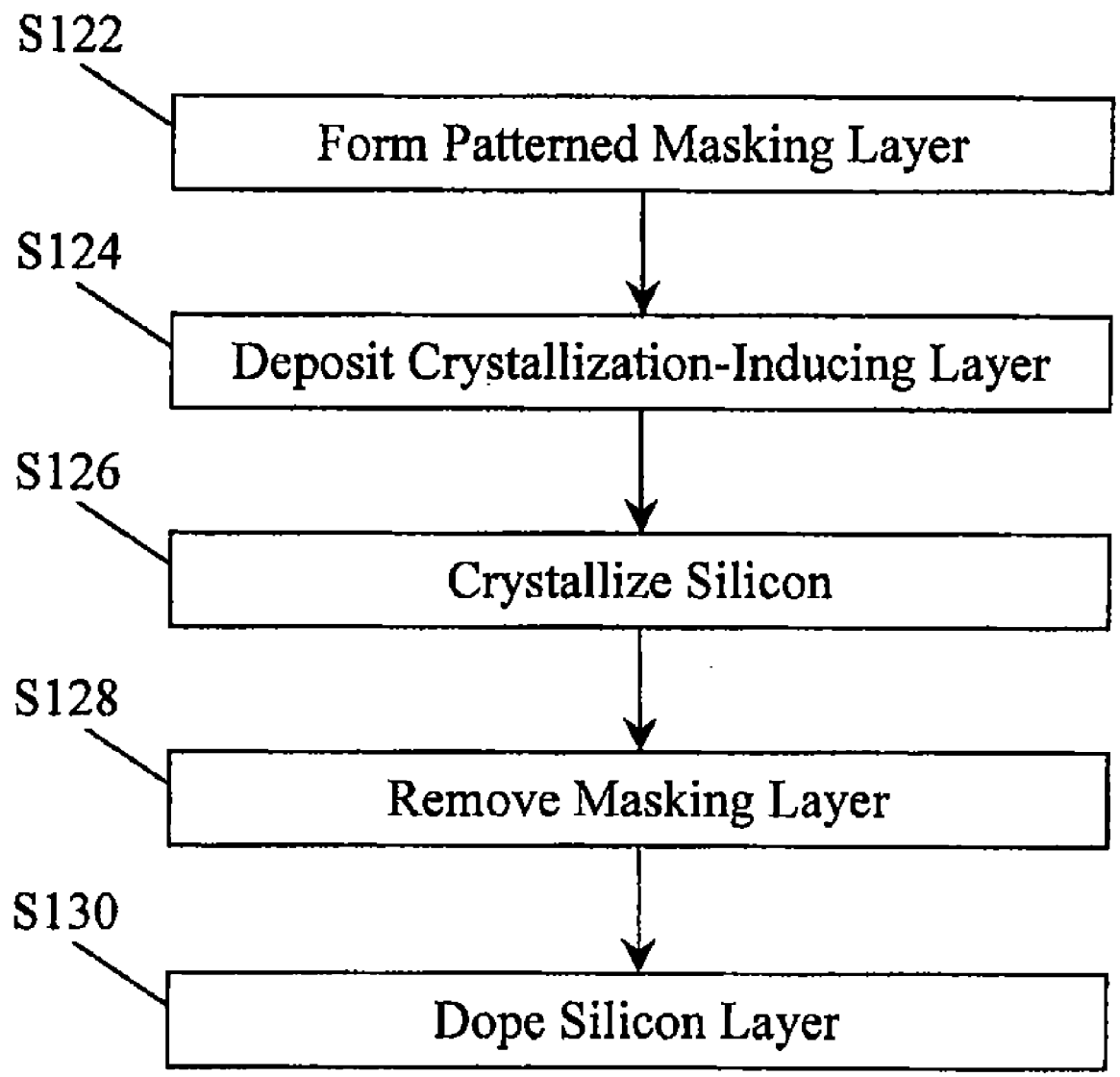
FIG. 4 is a further flowchart, relating to the silicon treating step of FIG. 3.

FIG. 4 is a further flowchart, relating to the silicon treating step S104 of FIG. 3. FIGS. 4 to 7 are schematic views showing different stages in the manufacture of an organic light emitting device, for example according to the method exemplified by the flowchart of FIGS. 3 and 4.

For the silicon treating step (step S104 of FIG. 3), a patterned masking layer is formed on the silicon layer (step S122 of FIG. 4), e.g. LTO with a thickness of 100 nm-300 nm. This should be capable of withstanding process temperatures for an extended period of time.

Figure 5:
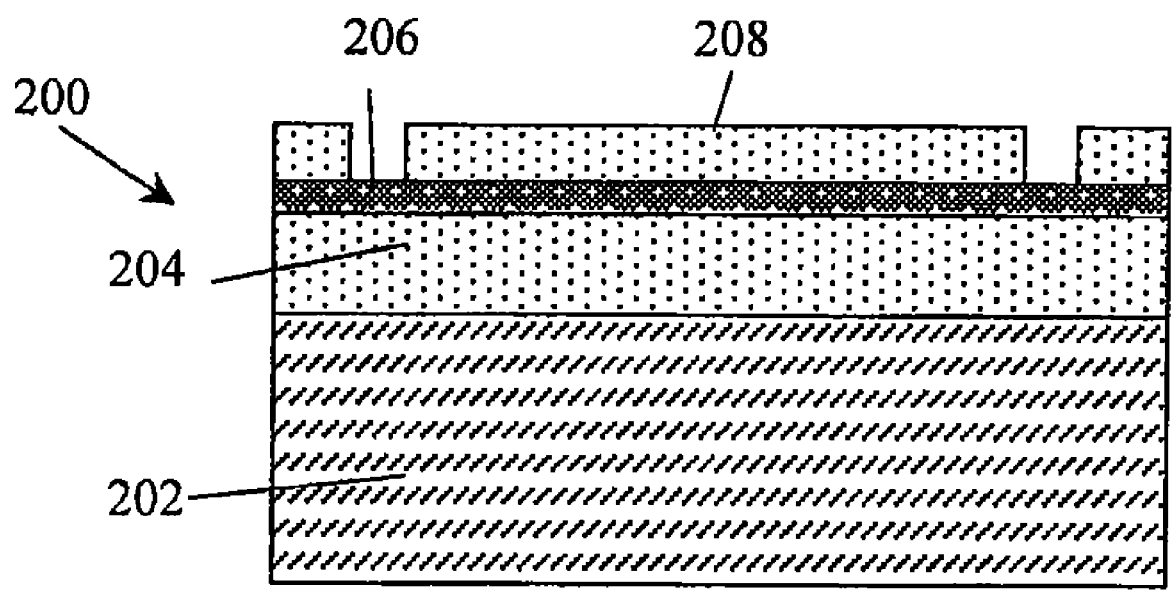
FIG. 5 is a schematic cross-section of a partially fabricated electrode.
Figure 6:
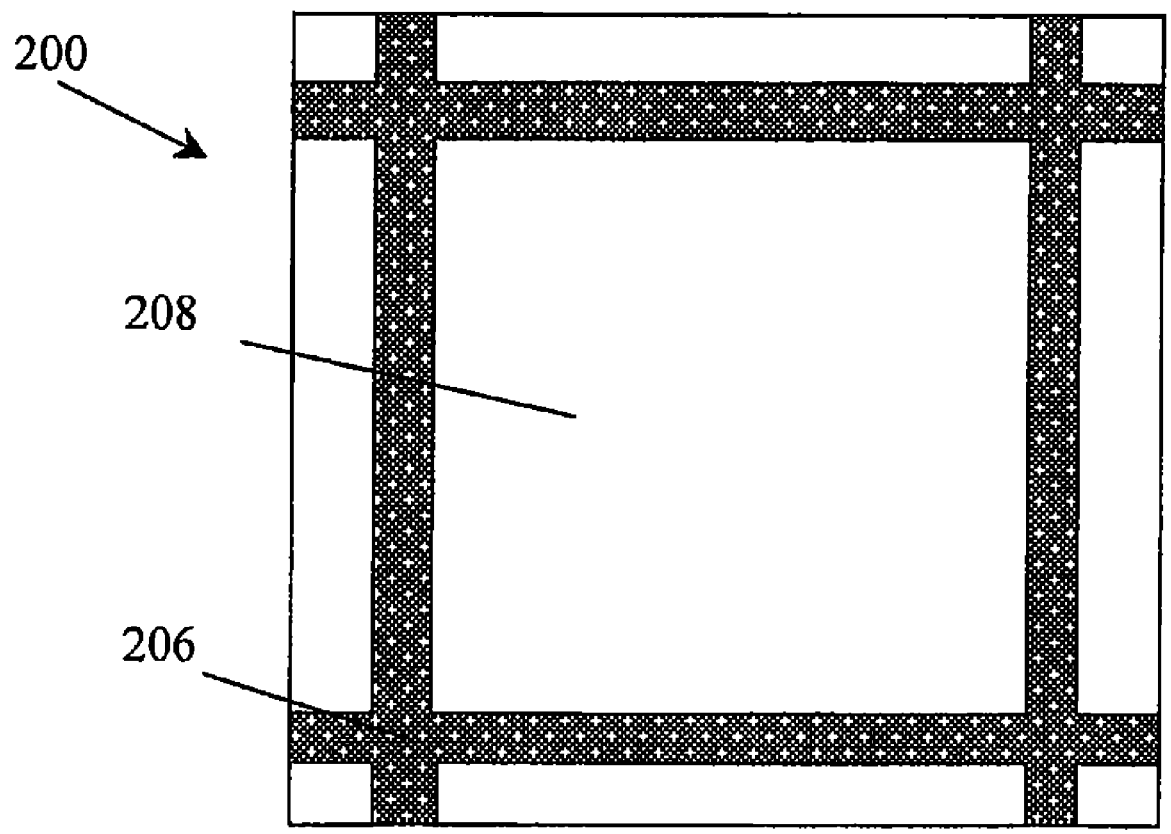
FIG. 6 is a schematic plan-view of the electrode of FIG. 5.

FIG. 5 is a schematic cross-section of a partially fabricated pixel-electrode of an OLED display 200, showing a substrate 202, a buffer layer 204, an amorphous silicon layer 206 and a patterned masking layer 208, in that order. Selected regions of the silicon layer 206 are not covered by the masking layer 208, as is shown in FIG. 6, which is a schematic plan-view of the electrode 200 of FIG. 5. The low temperature insulation patterns of FIG. 6 define the pixel electrodes of an OLED display.

Figure 7:
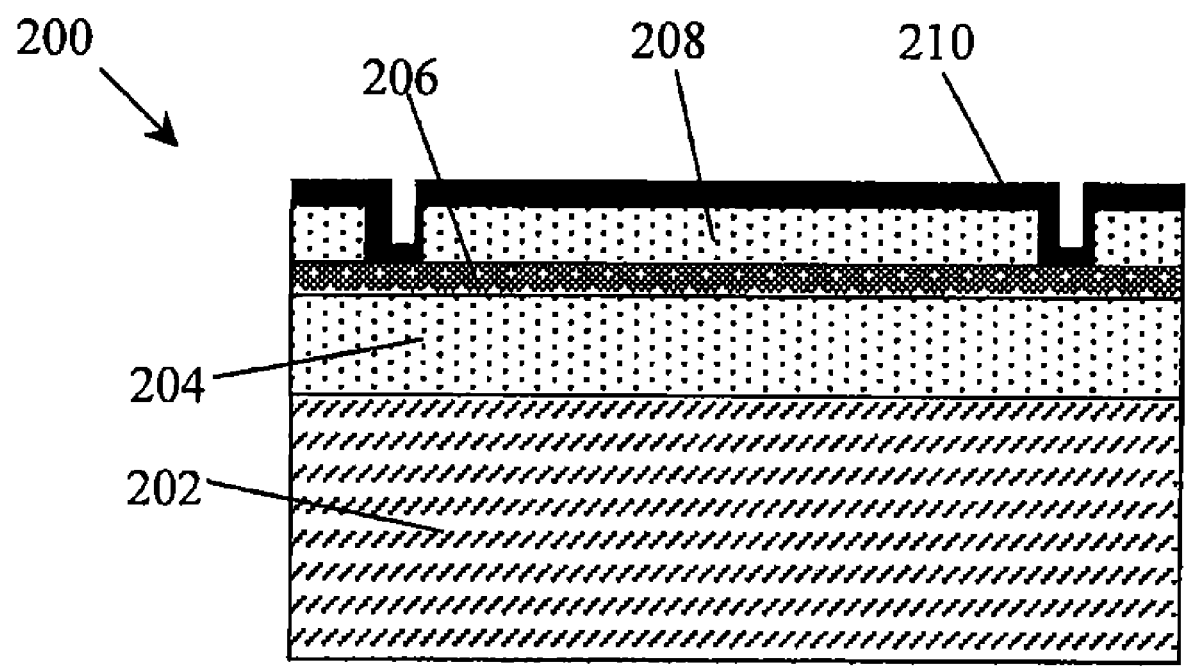
FIG. 7 shows the partially fabricated electrode of FIG. 5 with a further, Ni layer.

A crystallization-inducing layer 210 is deposited on the masking layer 208 (step S124), as shown in FIG. 7, contacting the silicon 206 where the masking layer 208 does not cover the silicon 206. In this embodiment the crystallization-inducing layer is nickel, although other metals or other substances may be used. The crystallization-inducing layer 210 can be deposited using a variety of techniques, including but not limited to evaporation, sputtering and solution coating.

The silicon is crystallized (step S126) by heat-treatment at a temperature between 350° C. to 600° C. Regions not covered by the masking layer 208 are vertically crystallized. Regions covered by the masking layer 208 are laterally crystallized. The laterally crystallized regions are able to act as an electrode. The patterning in the silicon layer therefore follows that of the masking layer as shown in FIG. 6. The masking layer and buffer need to withstand the process temperature used in this crystallization step. Thus, in this embodiment, they should be able to withstand a temperature of at least 350° C.

The above method which produces low temperature polycrystalline silicon (LTPS) is known as metal-induced lateral crystallization (MILC), although other processes can be used.

Figure 8:
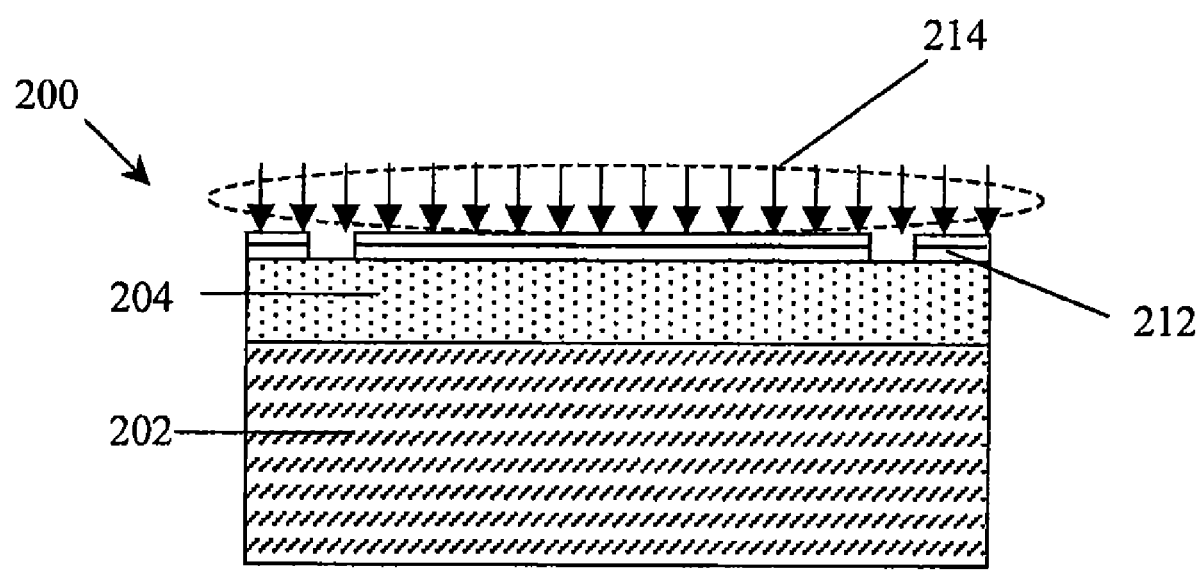
FIG. 8 is a schematic cross-section of the poly-Si electrode being doped.

The crystallization-inducing layer 210 is removed, as is the masking layer 208 (step S128), leaving metal-induced lateral crystallization poly-silicon film regions with gaps therebetween. FIG. 8 is a schematic cross-section of the MILC poly-Si layer 212 being doped (step S130) with a resistance-reducing impurity 214 after removal of the masking layer previously covering the polycrystalline silicon 212. Doping can be accomplished using a variety of techniques, including but not limited to ion implantation or ion shower. The dopants are subsequently activated, for example in a furnace in the temperature range of 450° C. to 620° C., in a rapid thermal processes or laser-induced heating. Typical dopants are $B^+$ or $BF_3^+$, with a doping ratio of 1E15 $cm^{-2}$-1E16 $cm^{-2}$. Sheet resistance should be no more than 10 KΩ/square, generally be less than 1 KΩ/square, and is typically from 0.1-1 KΩ/square. The MILC poly-Si layer 212 can be used as an electrode, for example in an OLED display.

Figure 9:
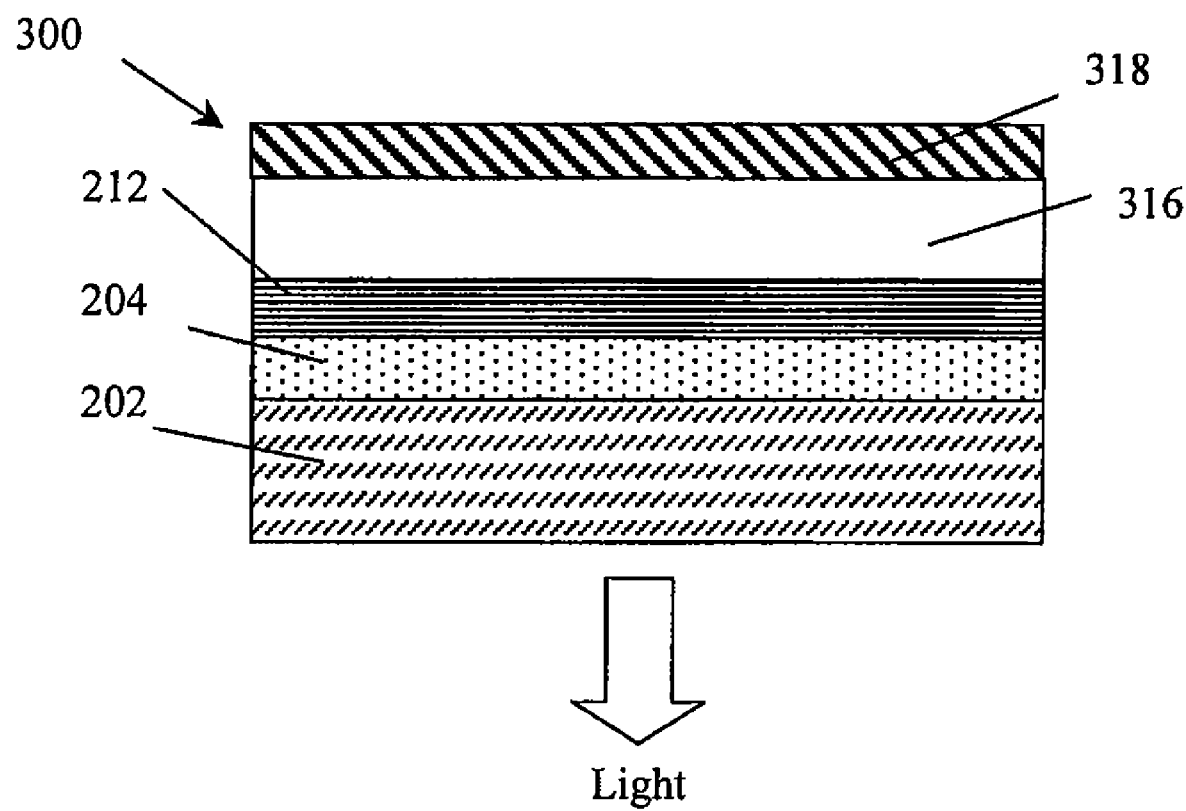
FIG. 9 is a schematic cross-section of an OLED cell including an electrode patterned on the poly-Si.

FIG. 9 is a schematic cross-section of an OLED cell 300 including an electrode patterned on the poly-Si that is formed according to the steps described above (although without the patterning in the poly-Si layer 212). This cell includes a substrate 202, buffer layer 204 and a bottom Poly-Si anode 212, which may be formed as described above with reference to FIGS. 3 to 8. An organic functional layer 316, for instance as described above, is formed on the Poly-Si anode 212 (step S106). A cathode 318, for instance as described above, is formed on the functional layer 316 (step S108). Such a display emits light through its base, in the direction of the arrow.

Figure 10:
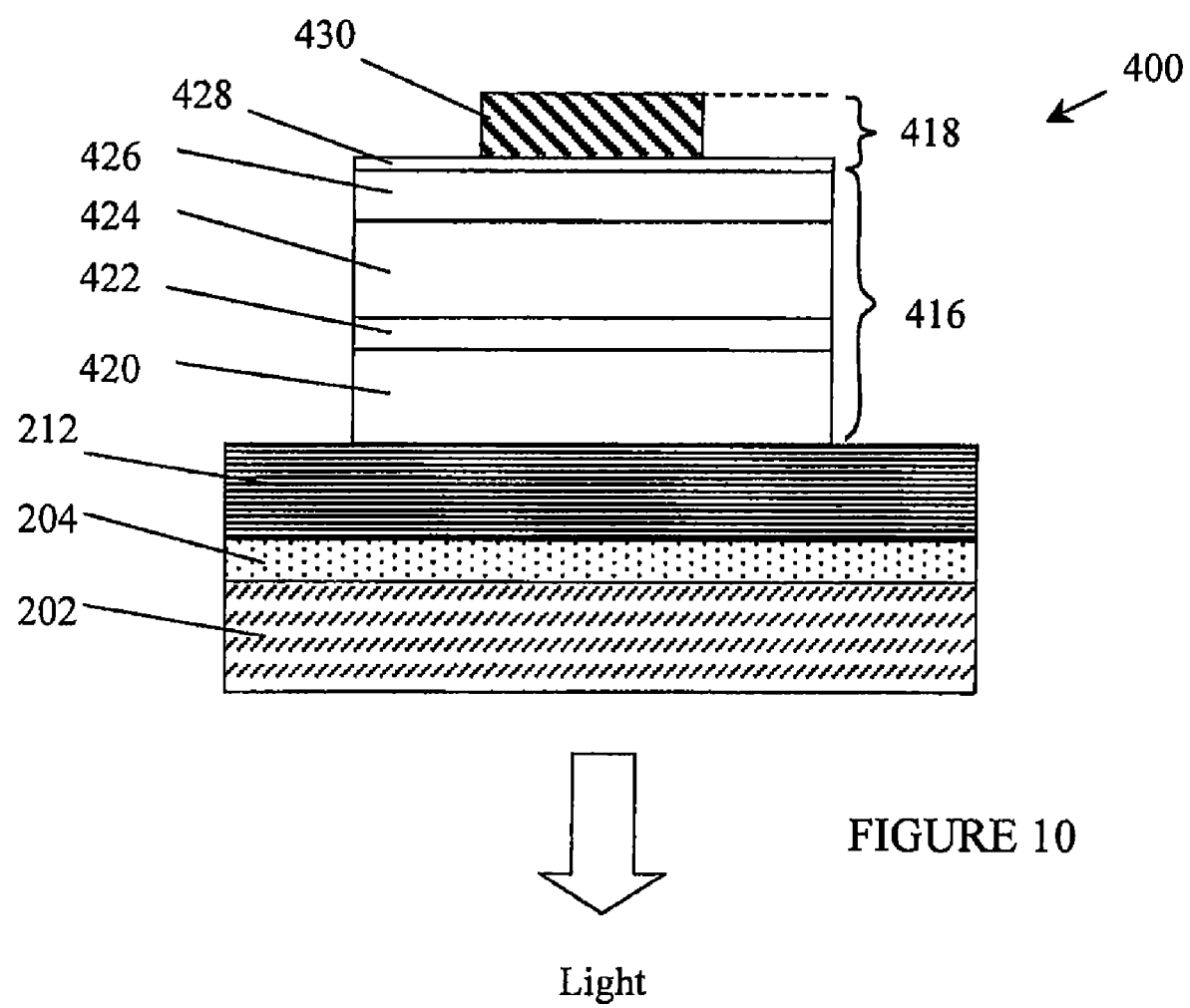
FIG. 10 is a schematic cross-section of a first embodiment of an OLED.

FIG. 10 is a schematic cross-section of a first example of an organic light emitting diode 400 of the present invention. This cell includes a substrate 202, buffer layer 204 and a bottom Poly-Si anode 212, which may be formed as described above with reference to FIGS. 3 to 8. An organic functional layer 416 is formed on the Poly-Si anode 212 (step S106). A cathode 418 is formed on the functional layer 416 (step S108). Such a display emits light through its base, in the direction of the arrow.

The organic functional layer 416 is made up of four layers: an m-MTDATA doped with F4-TCNQ layer 420 to function as a hole injection layer (HIL), an NPB layer 422 to function as a hole transport layer (HTL), an $Alq_3$ doped with C545-T layer 424 to function as an emissive layer (EML) and an undoped $Alq_3$ layer 426 to function as an electron transport layer (ETL). The thicknesses of these layers in this example are 400 angstroms, 100 angstroms, 300 angstroms and 200 angstroms, respectively. The doping ratios in the HIL and EML are 1% (by mole) and 2% (by weight), respectively.

The cathode 418 is a bi-layer, with a LiF layer 440, in this embodiment of the same width as the functional layers, below an Al layer 430, which is narrower. The thicknesses of these layers in this example are 10 angstroms and 1000 angstroms, respectively.

The device has an emitting area of about 4 $mm^2$ which is defined by the shadow mask, used during formation of the cathode. The organic layers and metal are thermally evaporated in separate vacuum chambers both under pressures lower than $10^{-6}$ torr.

Figure 1:
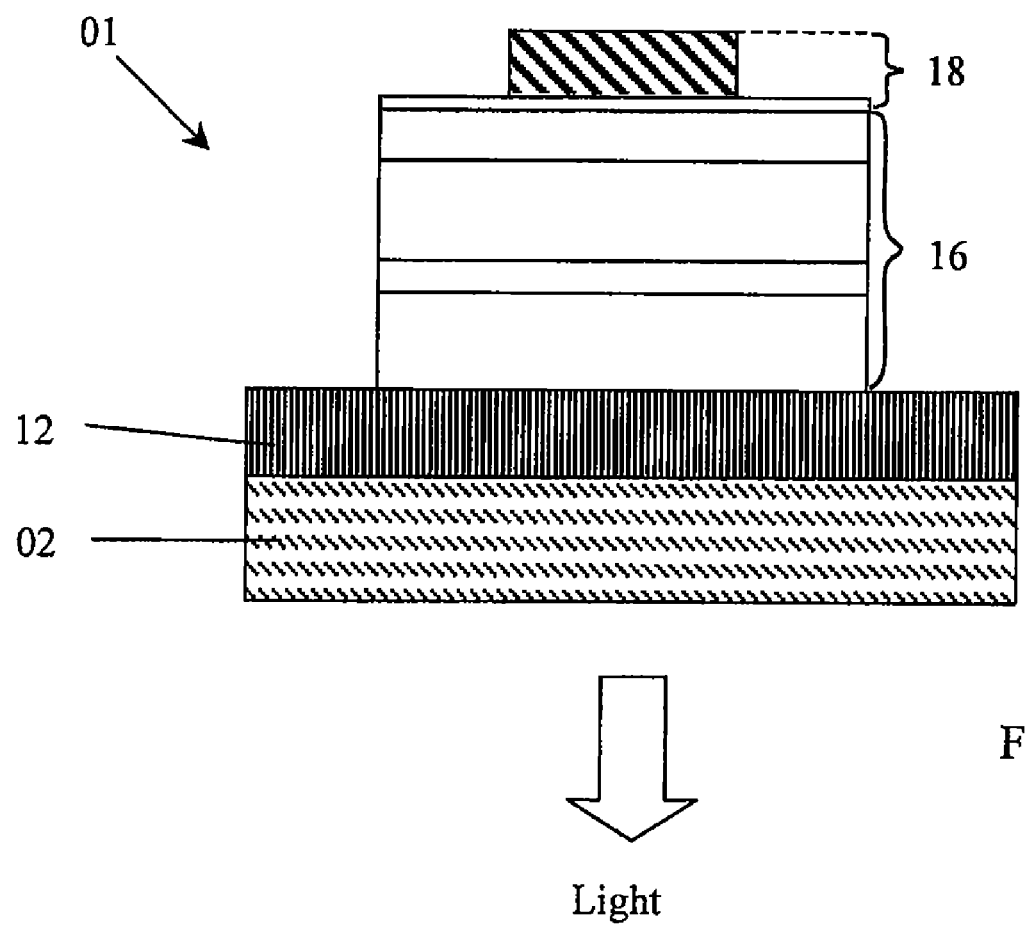
FIG. 1 is a schematic cross-section of a reference example of a conventional OLED.
Figure 11:
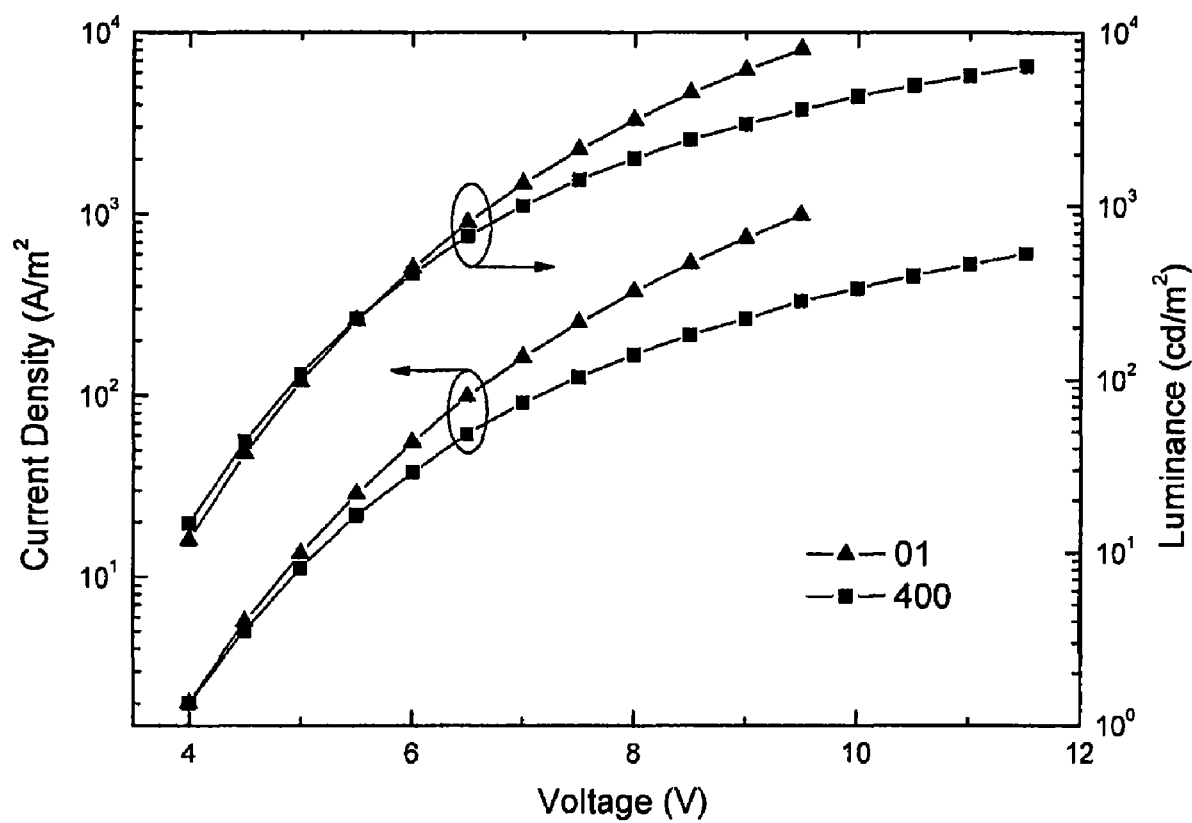
FIG. 11 is a Current Density-Voltage-Luminance graph for the OLED of FIG. 10.
Figure 12:
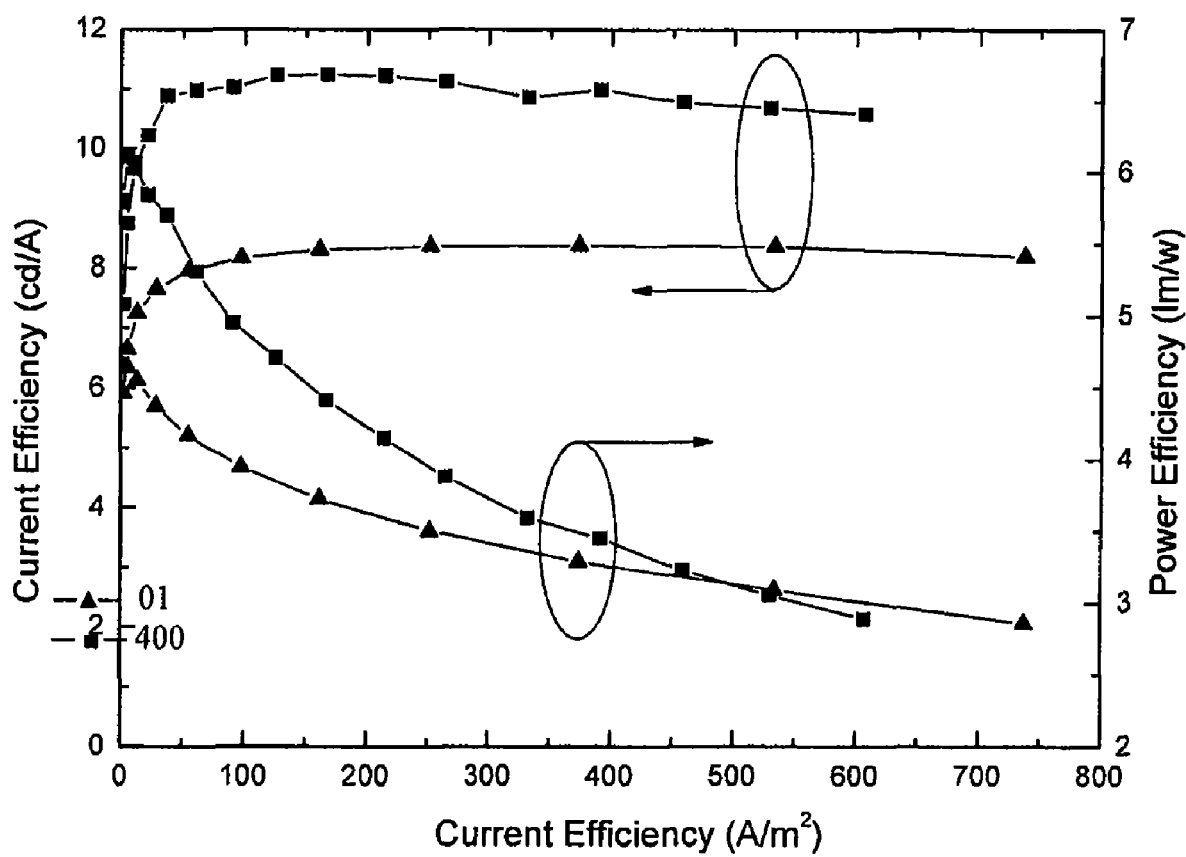
FIG. 12 is a Current Efficiency-Current Density-Power Efficiency graph for the OLED of FIG. 10.

FIGS. 11 and 12 are graphs showing comparative properties for the OLED 400 of FIG. 10 and a reference OLED 01 based on the prior art approach of FIG. 1, but with the organic functional layer 16 and the cathode 18 of the reference OLED the same as that of the exemplary OLED 400. For these graphs, the ITO film 12 of the reference OLED had a sheet resistance of 25 Ω/square and a thickness of 75 nm and the poly-Si anode of the exemplary OLED 400 had a sheet resistance of 200 Ω/square and a thickness of 50 nm. The buffer layer was 100 nm thick. For both devices, the thickness of the glass was 1.1 mm and the emitting area was 4 $mm^2$. Of course, these dimensions are exemplary and not limiting on the invention.

FIG. 11 is a Current Density-Voltage-Luminance graph for this first example of an organic light emitting diode (OLED) 400 of the invention and the reference OLED. The lower two curves show Current Density/Voltage. The upper two curves show Luminance/Voltage. The driving voltage range extends from 4V to 11.5V. FIG. 12 is a Current Efficiency-Current Density-Power Efficiency graph for this first example of an organic light emitting diode (OLED) 400 of the invention and the reference OLED. The upper two curves show Current Efficiency/Current Density. The lower two curves show Power Efficiency/Current Density.

Referring to the data plotted in FIGS. 11 and 12, comparison was made between the reference OLED device 01 and the first example of an OLED device 400. Due to the much smaller sheet resistance of the ITO anode 12 (25 Ω/square) compared with that of the Poly-Si anode 212 (200 Ω/square), the OLED device 01 of the reference example shows larger current density and higher luminance at the same applied voltage, especially at high applied voltages. Even so, the emission color of the exemplary device OLED 400 is very distinctively visible, even in bright daylight with sunshine. The limited effect of this electrode resistance is almost eliminated in AMOLED fabrication, as aluminum or some other suitable metal is used as a leading out electrode, whereas for the OLED 400, poly-Si is used as the leading out electrode for device measuring. The current efficiency of the first example 400 is generally above 10.5 cd/A, and relatively independent of the driving current within a wide range, and is significantly larger than that of the reference example.

The formation of a MILC-TFT is now described with reference to FIGS. 13 and 14.

Figure 13:
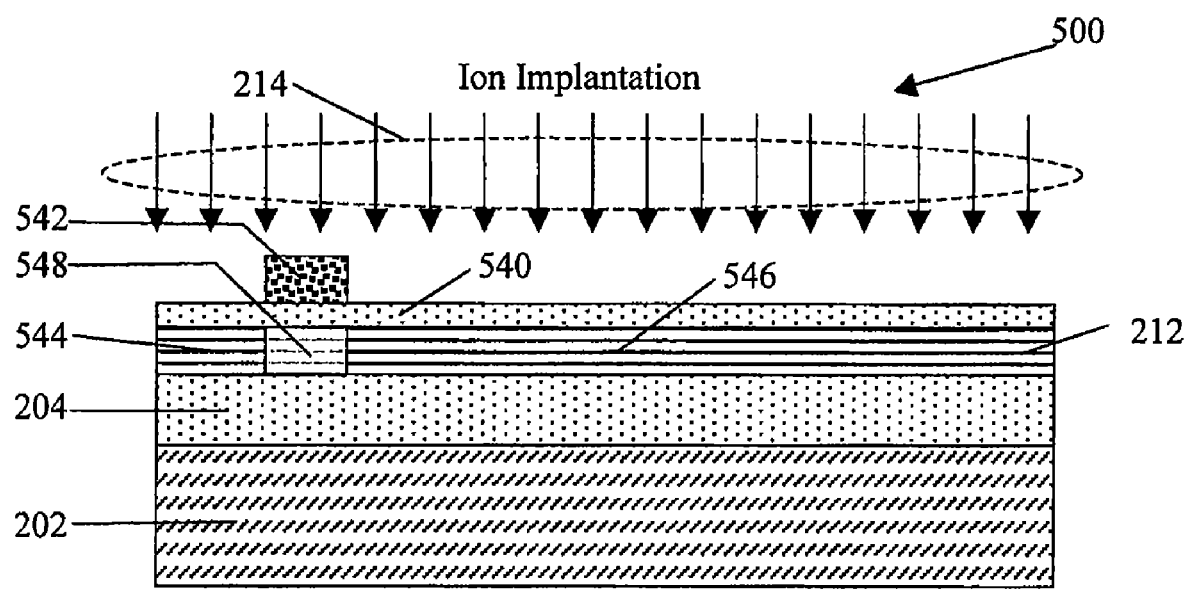
FIG. 13 is a schematic cross-section of an uncompleted MILC-TFT after doping.

FIG. 13 is a schematic cross-section of uncompleted MILC-TFT 500. A silicon layer is crystallized into a poly-Si layer 212, atop a buffer layer 204 on top of a substrate 202, as described above. A gate insulator layer 540, for example of LTO, is formed over the poly-Si layer 212. A gate electrode 542 is formed on a desired portion of the gate insulator layer 540, to one side. It is at this point that the poly-Si layer 212 is doped (S130), by way of resistance-reducing impurities 214, as mentioned with reference to FIG. 8.

Doping the poly-Si layer 212 divides it into two doped regions 544, 546, to act as the source and drain, separated by an undoped region 548 which functions as the channel of the MILC-TFT. This undoped region 548 is achieved through the use of the gate electrode 542 as a mask during the doping process.

Figure 14:
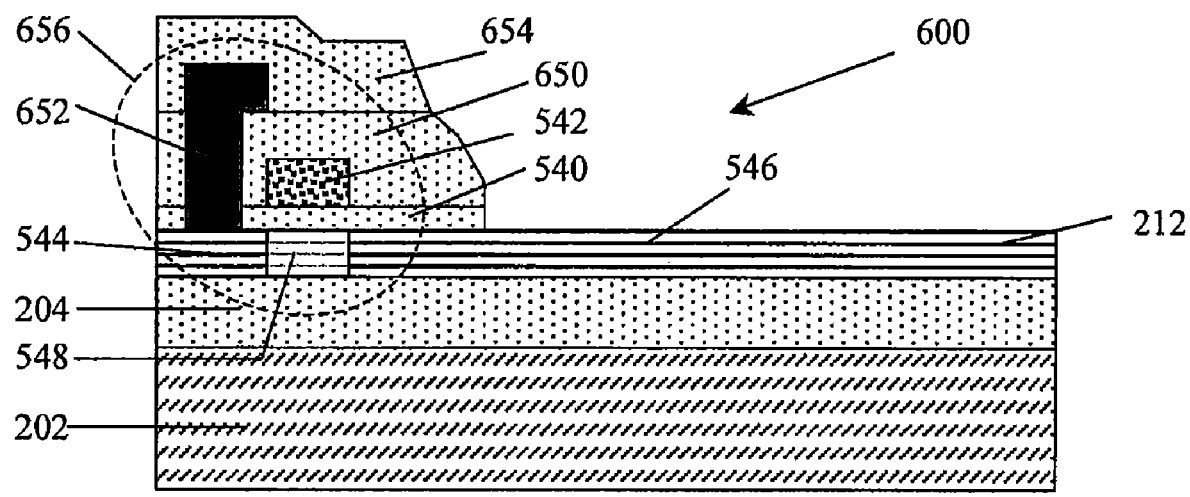
FIG. 14 is a schematic cross-section of an uncompleted AMOLED pixel.

FIG. 14 is the cross-section view of an uncompleted AMOLED pixel 600 using poly-Si as the anode (before deposition of an organic functional layer and cathode). The MILC poly-Si anode 212 is partially uncovered from the gate insulator layer 540. The uncovered portion is basically the extension of the drain 546 of the MILC-TFT. A local insulator layer 650, also preferably of LTO, is formed on the remaining gate insulator layer 540 to insulate the gate electrode 542 and a source metal electrode 652 formed through both the source insulator layer 650 and the remaining gate insulator layer 540 to contact the source region 544 of the poly-Si layer 212. A further, topmost insulator layer 654, again preferably of LTO, is used to protect the whole TFT 656 and to separate it from OLED layers that are formed thereafter.

The MILC-TFT 600 uses the pixel electrode 212 as the active layer of the TFT, with the separated doped regions 544, 546 as active islands. There is no need to sputter an ITO film onto the electrode 212, and no need for a further pixel pattern mask and contact hole mask to the electrode. Additionally, as the active layer of the TFT and the pixel electrode layer 212 are the same layer, there is no problem with contact and conduction between them. This leads to easier integration of the OLED with a thin-film transistor, which results in significant reductions in manufacturing costs. Moreover, as the drain of the TFT extends to form the pixel electrode 546, this allows a larger aperture ratio for the pixel, as there is no need for a metal pattern to connect them.

Figure 15:
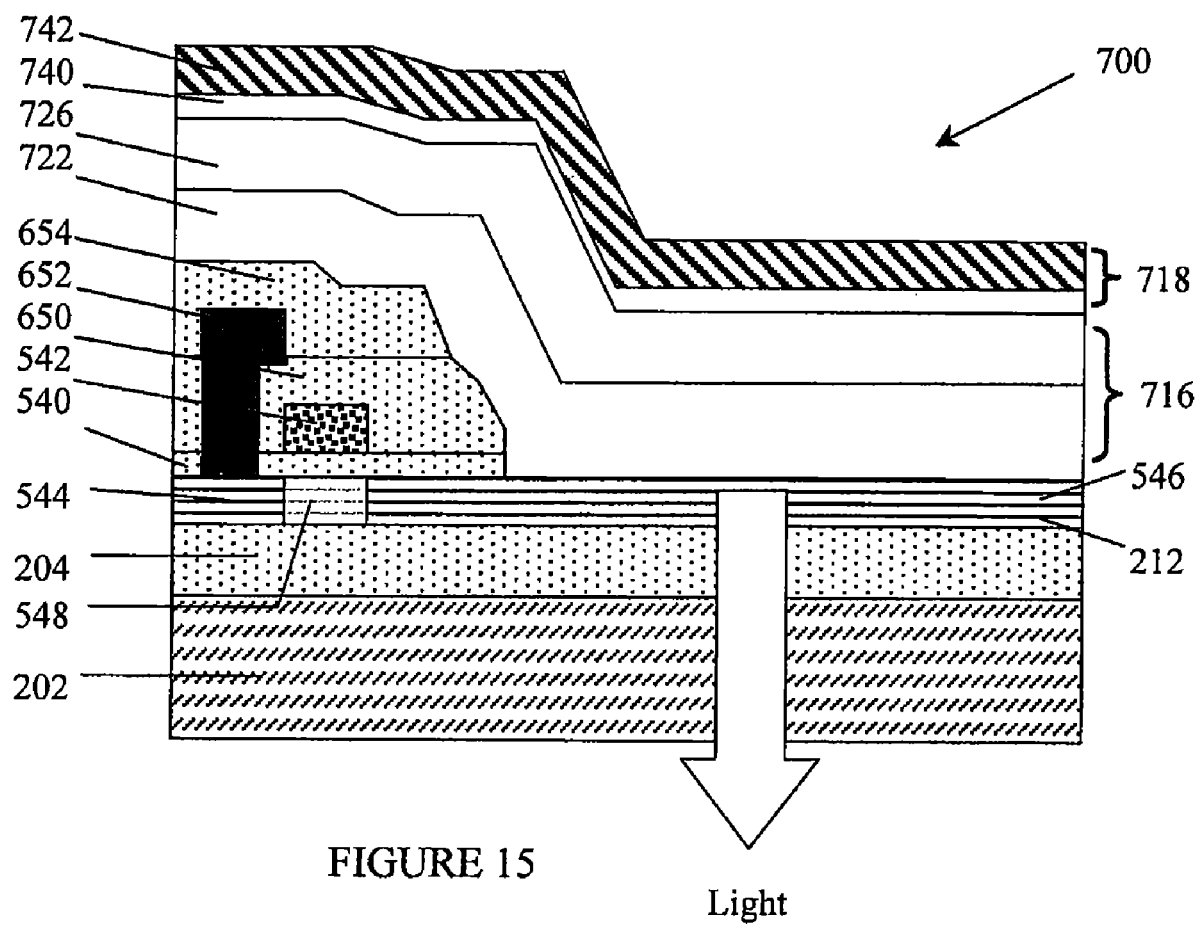
FIG. 15 is a schematic cross-section of an embodiment of an AMOLED.
Figure 16:
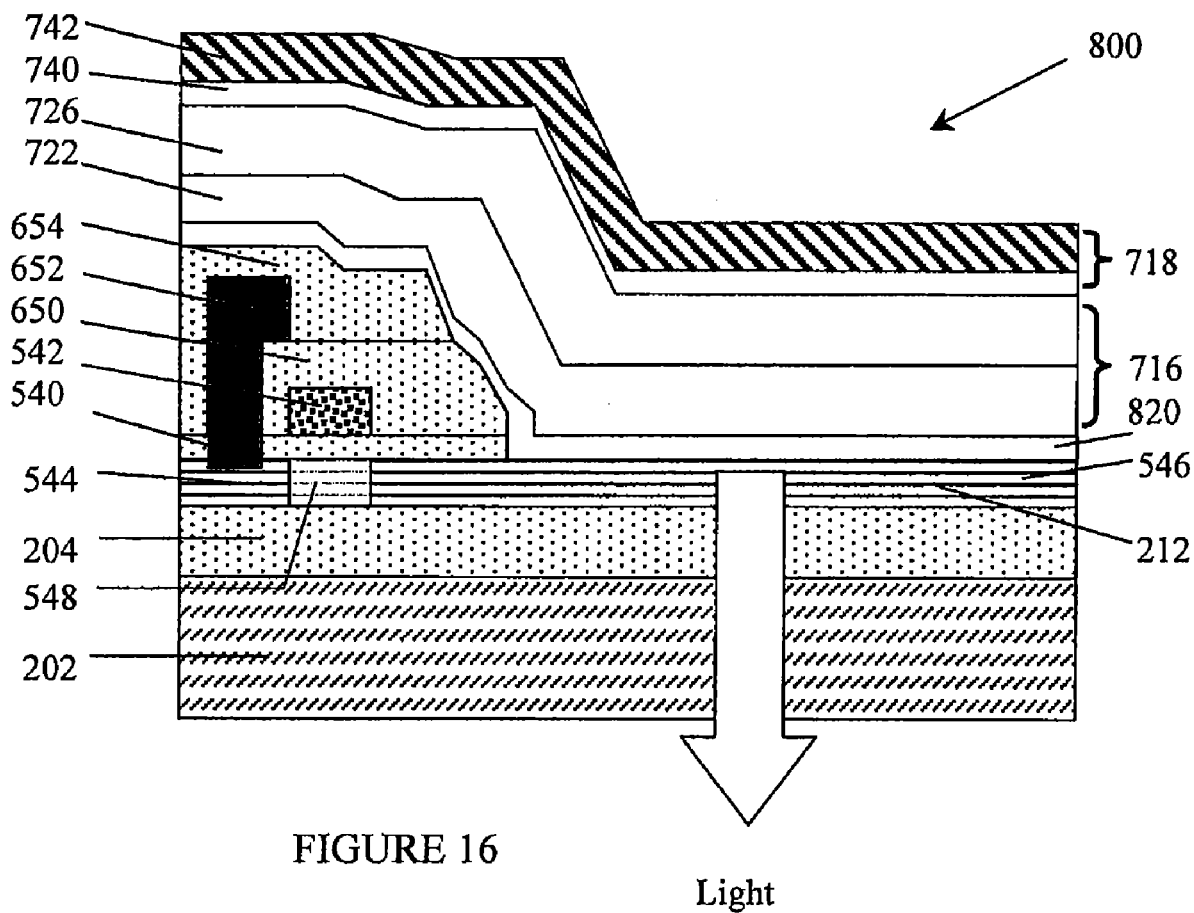
FIG. 16 is a schematic cross-section of another embodiment of an AMOLED.

FIGS. 15 and 16 are schematic cross-sections of two embodiments of AMOLED pixels 700, 800. These AMOLED pixels 700, 800 are completed versions of the uncompleted AMOLED pixel 600 of FIG. 14, using poly-Si as the anode. The organic functional layer is formed on the poly-Si anode 212 (step S106). A cathode 718 is formed on the functional layer (step S108). Such displays emit light through their bases, in the direction of the arrow.

The organic functional layer 716 of the embodiment of FIG. 15 is made up of two layers: an HTL 722, preferably NPB, and a combined EML and ETL 726, preferably Alq$_3$. This embodiment has no anode modification layer. The cathode 718 is a bi-layer, preferably LiF 740 and Al 742. For the graphs of FIGS. 17 to 19, which follow, the completed OLED portion of the AMOLED structure 700, according to this embodiment, is poly-Si/NPB (50 nm)/Alq$_3$ (50 nm)/LiF (1 nm)/Al (100 nm).

The embodiment of FIG. 16 differs from that of FIG. 15 by the presence of a HIL 820, preferably a V$_2$O$_5$ layer, in the organic functional layer 816 between the poly-Si layer 212 and the HTL 722. For the graphs of FIGS. 17 to 19, which follow, the completed OLED structure 800 is poly-Si/V$_2$O$_5$ (3 nm)/NPB (50 nm)/Alq$_3$ (50 nm)/LiF (1 nm)/Al (100 nm).

Figure 17:
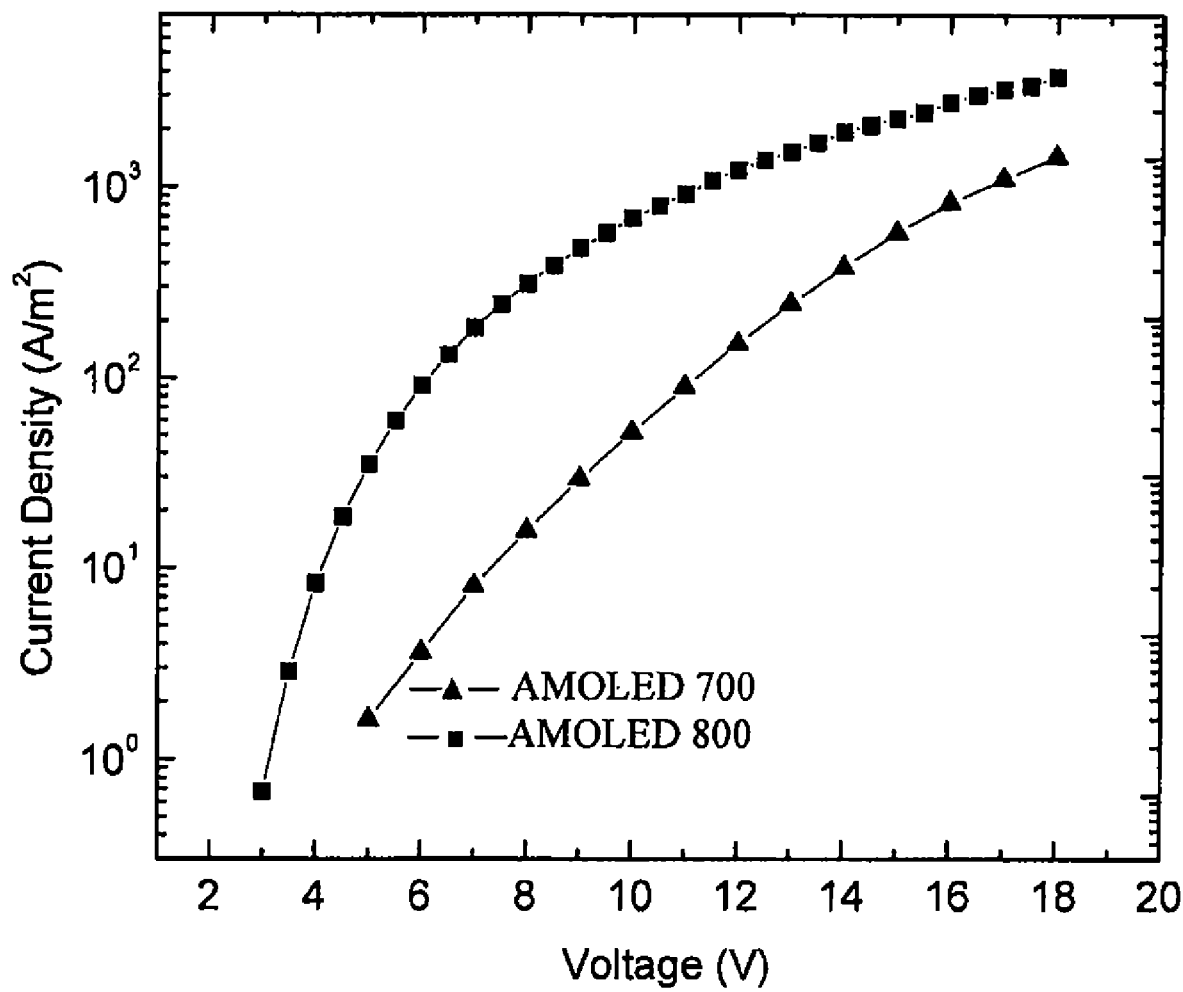
FIG. 17 is a graph of Current Density-Voltage characteristics for the OLED portions of the AMOLEDs of FIGS. 15 and 16.

FIG. 17 is a Current Density-Voltage graph showing curves for the OLED portions of the AMOLEDs 700, 800 of FIGS. 15 and 16. The current density of the OLED portion of the AMOLED 800 of FIG. 16 is much larger than that of the OLED portion of the AMOLED 700 of FIG. 15 at the same driving voltage.

Figure 18:
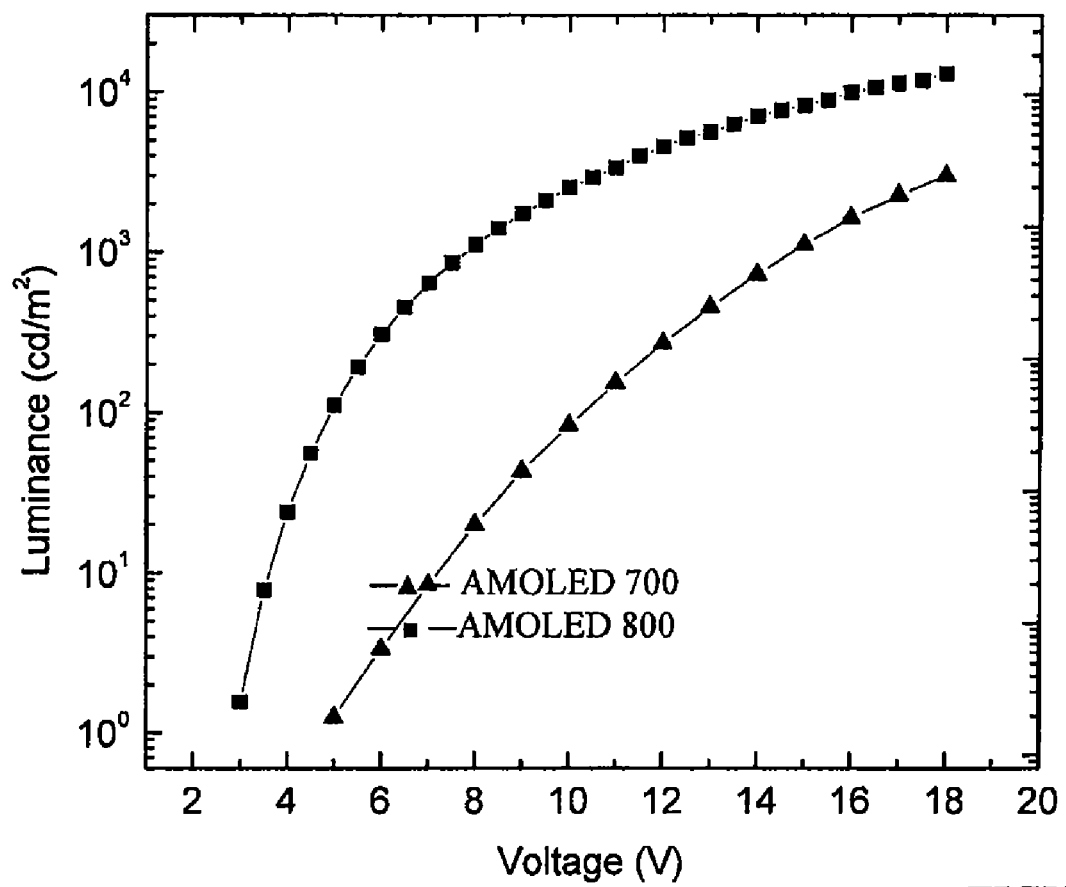
FIG. 18 is a graph of Luminance-Voltage characteristics for the OLED portions of the AMOLEDs of FIGS. 15 and 16.

FIG. 18 is a Luminance-Voltage graph showing curves for the OLED portions of the AMOLEDs 700, 800 of FIGS. 15 and 16. The turn-on voltage (at 1 cd/m$^2$) is 5V and 3V for the OLED portions of the AMOLEDs 700, 800 of FIGS. 15 and 16, respectively.

Figure 19:
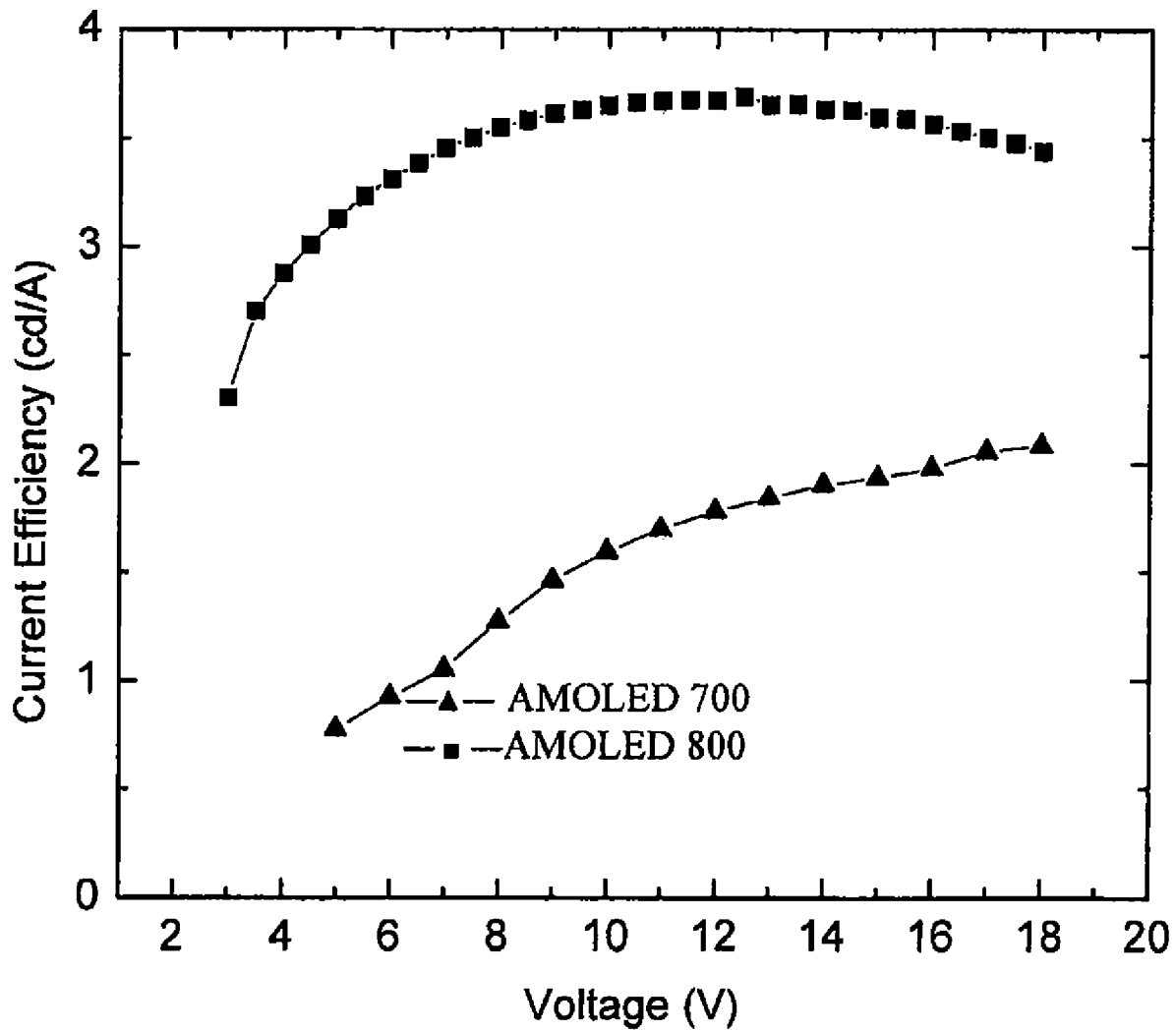
FIG. 19 is a graph of Current Efficiency-Voltage characteristics for the OLED portions of the AMOLEDs of FIGS. 15 and 16.

FIG. 19 is a Current Efficiency-Voltage graph showing curves for the OLED portions of the AMOLEDs 700, 800 of FIGS. 15 and 16. The maximum current efficiency of the OLED portion of the AMOLED 800 of FIG. 16 is ~3.7 cd/A, almost double that of the OLED portion of the AMOLED 700 of FIG. 15 (~2.0 cd/A).

Thus, whilst the AMOLED 700 of FIG. 15 works, the AMOLED 800 of FIG. 16, which differs only in having the V$_2$O$_5$ layer coating the MILC Poly-Si film anode, functions noticeably better.

OLED and AMOLED displays produced according to the present invention can be light-weight, ultra-thin, and self-emitting, whilst offering video quality emissions with a wide viewing angle. The invention replaces conventional ITO with Poly-Si and the same Poly-Si can be used for both the OLED electrode and transistor active island to reduce manufacturing costs. Use of the invention allows elimination of (1) deposition and patterning of and (2) formation of the contact holes to the indium-tin oxide electrode. This significantly reduces manufacturing costs.

Whilst only specific embodiments have been described, the invention is not limited thereto, but covers other aspects having the same spirit and scope, including as covered by the accompanying claims in their broadest construction.

The invention claimed is:

1. An organic light emitting device comprising:
    an anode for use in light-emission, of low temperature polycrystalline silicon;
    an anode modification layer for hole injection;
    a plurality of organic layers for electron and hole transport;
    an organic light emission layer; and
    a cathode.

2. An organic light emitting device according to claim 1, wherein the anode is formed by one or more of metal-induced lateral crystallization, metal-induced crystallization of amorphous silicon and laser annealing of amorphous silicon.

3. An organic light emitting device according to claim 1, wherein the polycrystalline silicon anode is doped.

4. An organic light emitting device according to claim 3, wherein the polycrystalline silicon anode is doped with at least one of B$^+$ and BF$_3^+$.

5. An organic light emitting device according to claim 1, wherein the polycrystalline silicon anode has a resistance of no more than 10 kΩ/square, preferably no more than 1 kΩ/square.

6. An organic light emitting device according to claim 1, wherein the polycrystalline silicon anode has an average absorptivity of no more than 30% in the visible light spectrum, preferably around 20%.

7. An organic light emitting device according to claim 1, wherein the polycrystalline silicon is transparent or translucent.

8. An organic light emitting device according to claim 1, further comprising a substrate and a buffer layer between the substrate and the anode.

9. An organic light emitting device according to claim 8, wherein the buffer layer comprises at least one of LTO and $SiN_x$.

10. An organic light emitting device according to claim 1, wherein the polycrystalline silicon comprises thin film polycrystalline silicon.

11. An organic light emitting device according to claim 10, wherein the thin film polycrystalline silicon is from 10 nm to 300 nm, preferably 30 nm to 100 nm and most preferably about 50 nm thick.

12. An organic light emitting device according to claim 1, further comprising a transistor having at least a first active island and wherein the polycrystalline silicon anode comprises the first active island of the transistor.

13. An organic light emitting device according to claim 12, wherein the first active island of the transistor comprises a drain of the transistor.

14. An organic light emitting device according to claim 12, wherein the transistor further comprises a second active island of the transistor formed of polycrystalline silicon, with the polycrystalline silicon anode.

15. An organic light emitting device according to claim 12, wherein the transistor further comprises a source which is formed of polycrystalline silicon in the same layer and with the polycrystalline silicon anode.

16. An organic light emitting device according to claim 12, wherein the transistor is a thin film transistor.

17. An active matrix organic light emitting device comprising:
an anode for use in light emission, of low temperature polycrystalline silicon;
one or more light emission layers, wherein at least one said layer is an organic light emission layer;
a cathode; and
a transistor having at least one active island; wherein the anode comprises an active island of the transistor.

18. An active matrix organic light emitting device according to claim 17, wherein the at least one active island of the transistor comprises a drain and the polycrystalline silicon anode comprises the drain of the transistor.

19. An active matrix organic light emitting device according to claim 17, wherein the transistor comprises a second active island of the transistor formed of polycrystalline silicon, with the polycrystalline silicon anode.

20. An active matrix organic light emitting device according to claim 17, wherein the at least one active island of the transistor comprises a source of the transistor formed of polycrystalline silicon in the same layer and with the polycrystalline silicon anode.

21. An active matrix organic light emitting device according to claim 17, wherein the transistor is a thin film transistor.

22. An active matrix display comprising an array of pixels, each of a plurality of said pixels comprising:
an anode made of low temperature polycrystalline silicon;
one or more light emission layers, wherein at least one said layer is an organic light emission layer;
a cathode; and
a thin film transistor.

23. An active matrix display according to claim 22, wherein the thin film transistors comprise active layers of low temperature polycrystalline silicon formed in the same processing step as the anodes.

24. An organic light emitting device according to claim 1, wherein said anode modification layer comprises a thin inorganic layer.

25. An organic light emitting device according to claim 24, wherein said thin inorganic layer is selected from the group consisting of: $V_2O_5$, $RuO_2$, $PrO$, $NiO_x$, $MoO_x$ and $CuO_x$.

26. An organic light emitting device according to claim 24, wherein said thin inorganic layer has a thickness in the range of 0.5 nm-5 nm.

27. An organic light emitting device according to claim 1, wherein said anode modification layer comprises an ultra-thin metal layer.

28. An organic light emitting device according to claim 27 wherein said ultra-thin metal layer is selected from the group consisting of: Pt and Au.

29. An organic light emitting device according to claim 27, wherein said ultra-thin metal layer has a thickness in the range of 0.5 nm-3 nm.

30. An organic light emitting device according to claim 1, wherein said anode modification layer comprises a p-type doped organic layer.

31. An organic light emitting device according to claim 30, wherein said p-type doped organic layer comprises $F_4$-TCNQ doped m-MTDATA.

32. An organic light emitting device according to claim 1, wherein the plurality of layers, comprise one or more organic layers for light emission.

33. An organic light emitting device according to claim 1, wherein the cathode comprises one or more layers.

34. An organic light emitting device according to claim 33, wherein the cathode comprises a monolayer of metal.

35. An organic light emitting device according to claim 34, wherein the monolayer of metal is selected from the group consisting of an aluminum layer and a silver layer.

36. An organic light emitting device according to claim 33, wherein the cathode comprises a bi-layer structure.

37. An organic light emitting device according to claim 36, wherein the bi-layer structure is LiF/aluminum.

38. An organic light emitting device according to claim 33, wherein the cathode comprises a tri-layer structure.

39. An organic light emitting device according to claim 37, wherein the tri-layer structure is selected from the group consisting of LiF/Aluminum/Silver and LiF/Calcium/Silver.

40. An organic light emitting device according to claim 1, further comprising a substrate.

41. An organic light emitting device according to claim 40, wherein the substrate is transparent or translucent.

* * * * *